United States Patent [19]
Kroll

[11] Patent Number: 5,451,295
[45] Date of Patent: Sep. 19, 1995

[54] PROCESS FOR REMOVING FILM FROM A SUBSTRATE

[75] Inventor: Gary H. Kroll, Boise, Id.

[73] Assignee: Micron Technology, Inc., Boise, Id.

[21] Appl. No.: 226,567

[22] Filed: Apr. 12, 1994

[51] Int. Cl.6 .......................... B44C 1/22; C03C 15/00
[52] U.S. Cl. ......................................... 216/52; 216/48; 156/659.11
[58] Field of Search ............ 156/635, 655, 657, 659.1, 156/668, 904; 134/2

[56] References Cited

U.S. PATENT DOCUMENTS

| | | | |
|---|---|---|---|
| 4,119,483 | 10/1978 | Hubsch et al. | 156/655 |
| 4,448,636 | 5/1984 | Baber | 156/655 X |
| 4,519,872 | 5/1985 | Anderson et al. | 156/655 X |
| 4,586,980 | 5/1986 | Hirai et al. | 156/655 |
| 5,275,689 | 1/1994 | Felten et al. | 156/635 |

*Primary Examiner*—William Powell
*Attorney, Agent, or Firm*—Hopkins, Roden, Crockett, Hansen & Hoopes

[57] ABSTRACT

A method for removing film from a substrate, and more particularly, photoresist from a semiconductor wafer, by a shear stress process. A wafer is coated with a medium having coefficients of thermal expansion and elasticity, such as water, and then cooled. The cooling causes shear stress to occur between the photoresist and the wafer, thereby loosening the photoresist from the wafer. The wafer is then heated to remove the medium and photoresist from the wafer. The coating, cooling and heating steps are repeated until all of the photoresist is removed. Relative to the prior art, this invention provides a novel process for removing film from a substrate that minimizes expense; substantially cuts processing time; is less complex; less hazardous; and environmentally favorable.

18 Claims, 2 Drawing Sheets

FIG. 1A
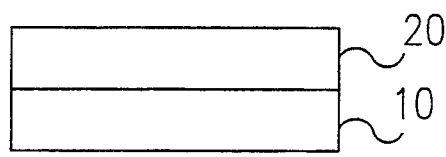
FIG. 1B
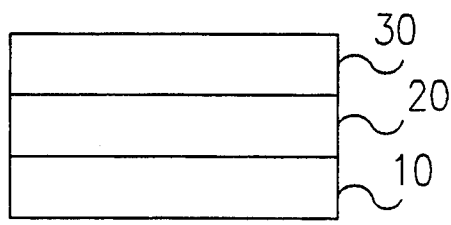
FIG. 1C
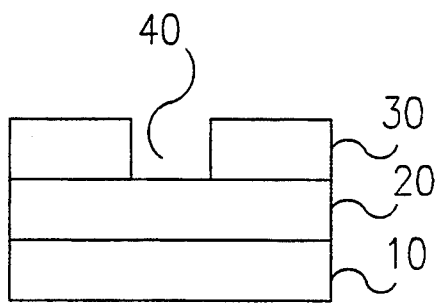
FIG. 1D
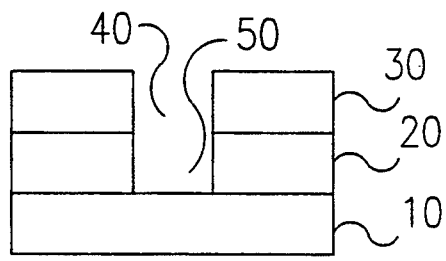
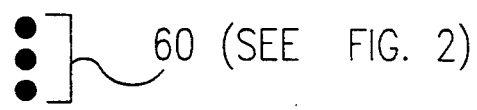
FIG. 1E

PROCESS FOR REMOVING FILM FROM A SUBSTRATE

TECHNICAL FIELD

This invention relates in general to a method of removing film from a substrate, and in particular, to a method of removing photoresist from a semiconductor wafer.

BACKGROUND OF THE INVENTION

Photoresist is a light-sensitive material commonly used on a semiconductor wafer for creating a pattern on the wafer from a mask design requirement for microchip fabrication. The structure and properties of photoresist change upon exposure to light. For example, in a negative acting photoresist, that portion of the photoresist exposed to light is polymerized to an insoluble condition, whereas that portion not exposed to light remains soluble.

The soluble, unpolymerized photoresist is easily removed to expose the patterned portion of the wafer. In contrast, the polymerized portion remains insoluble and is subsequently hard baked on to the wafer to become an impenetrable etch barrier for the etching process. The etching process permanently transfers the patterned image into the surface layer of the wafer.

After etching, the patterned portion is a permanent part of the wafer, and consequently, the resist layer that has served as an etch barrier is no longer needed. Therefore, the polymerized photoresist must be removed to complete the fabrication of the microchips on the wafer. However, the hard bake has made the photoresist extremely difficult to remove from the wafer. Accordingly, the processes for removing the baked photoresist are commonly known as wet and dry stripping.

Wet stripping generally involves the use of chemicals reacting to remove the hardened photoresist, of which sulfuric acid and hydrogen peroxide are the most common. Although other chemicals are also used, most retain undesirable, and sometimes hazardous features that are commonly associated with chemicals in general.

Dry etching is often referred to as plasma etching. Plasma etching is also a chemical process, but uses plasma energy to force the reaction, thus requiring a chemical etchant and an energy source. The energy sources creates a radiofrequency field through electrodes, consequently energizing a gas to a plasma state which acts as the etch medium. No wet chemicals or rinsing are involved. However, this type of dry etching retains its own undesirable drawbacks since it requires a somewhat complex system to produce the results, i.e., an energy source, chamber, vacuum, and gas supply.

Ion beam etching and reactive ion etching are also dry etching processes, but like unto plasma etching, each retain their own disadvantages and require complex systems necessary to perform the etching.

Obviously, such complex, time consuming, expensive and potentially hazardous methods for removing photoresist from a semiconductor wafer are not desirable features that accompany the prior-an techniques. Accordingly, objects of the present invention are to provide an improved method for removing film from a substrate, such as photoresist from a semiconductor wafer.

SUMMARY OF THE INVENTION

According to principles of the present invention in its preferred embodiment, photoresist is removed from a semiconductor wafer by shear stress techniques. The wafer is coated with a medium having coefficients of thermal expansion and elasticity, such as water, and then cooled to a solid state. The cooling causes shear stress to occur between the photoresist and the wafer, thereby loosening the photoresist from the wafer. The wafer is then heated to remove the medium and photoresist from the wafer.

According to further principles of the present invention, the coating, cooling and heating steps are repeated until all of the photoresist is removed.

Relative to the prior art, this invention provides a novel process for removing film from a substrate that minimizes expense; substantially cuts processing time; is less complex; less hazardous; and environmentally favorable.

Other objects, advantages, and capabilities of the present invention will become more apparent as the description proceeds.

BRIEF DESCRIPTION OF THE DRAWINGS

FIGS. 1A–E depict cross sectional views of a semiconductor wafer in various stages of a photomasking process, and the role of photoresist, in the prior art.

DETAILED DESCRIPTION OF THE INVENTION

Figure 2A:
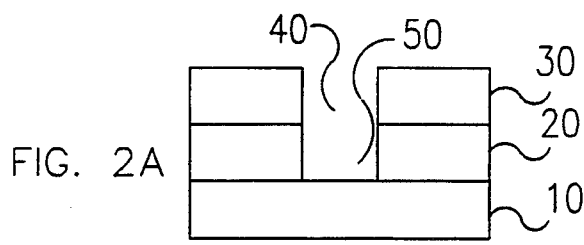
FIGS. 2A–F depict cross sectional views of a semiconductor wafer in various stages of the process of the present invention for removal of photoresist from the wafer using the novel shear stress method.

FIGS. 1A–E depicts cross sectional views of a semiconductor wafer in various stages of a photomasking process, and the role of photoresist, in the prior art. FIG. 1A depicts wafer 10, having silicon nitride layer 20 thereon, ready to proceed with the photomasking process. Wafer 10 may comprise other layers of material, such as an oxidation layer, but any such other layers are not shown for simplicity purposes. FIG. 1B depicts photoresist layer 30 on silicon nitride layer 20, ready to be masked and exposed with an appropriate design pattern. FIG. 1C depicts photoresist layer 30 after exposure to light wherein the photoresist was polymerized, except for pattern portion 40 which was not exposed to light and consequently not polymerized, and was therefore easily rinsed away to reveal pattern portion 40 and silicon nitride layer 20 thereunder.

FIG. 1D depicts silicon nitride layer 20 permanently etched away to reveal pattern portion 50, defined identical to and by pattern 40 of photoresist layer 30. Ellipses 60 represent the steps (not shown) necessary to remove photoresist layer 30, after etching has occurred in FIG. 1D, to obtain the results depicted in FIG. 1E. FIG. 1E depicts pattern portion 50 in etched silicon nitride layer 20 on wafer 10, with all of photoresist 30 completely removed.

FIGS. 2A–F depicts cross sectional views of a semiconductor wafer in various stages of the process of the present invention for removal of photoresist from the wafer using the novel shear stress method. The process defined by FIGS. 2A–F occurs in the photomasking process at the stage depicted by ellipses 60 between FIG. 1D and FIG. 1E.

FIG. 2A illustrates a semiconductor wafer 10 having silicon nitride layer 20 that has been etched with pattern 50, and photoresist layer 30 remaining on the silicon nitride layer ready to be removed. Since FIG. 2A depicts the photomasking stage where the photoresist is to be removed, it consequently is identical to FIG. 1D, wafer 10 may comprise other layers of material, such as an oxidation layer, but any such other layers are not shown for simplicity purposes.

Also, it should be noted here that, although the preferred embodiment of the present invention identifies a novel shear stress process for the removal of photoresist from a semiconductor wafer, photoresist is simply a type of film, and a semiconductor wafer is simply a substrate. Accordingly, this novel shear stress process is equally applicable to any film existing on any substrate material.

Figure 2B:
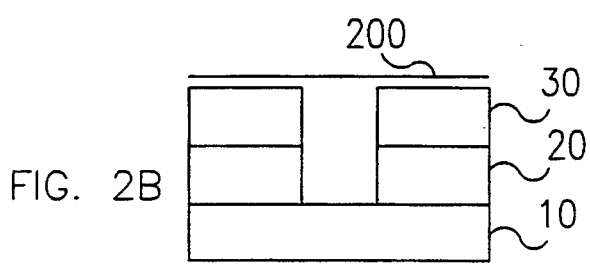

FIG. 2B illustrates a medium 200 substantially coating photoresist 30. Preferably, medium 200 substantially uniformly coats photoresist 30. Medium 200 has coefficients of thermal expansion and elasticity to enable it to expand and contract in response to applied heat. In the preferred embodiment, medium 200 is a liquid, such as water. However, other mediums may likewise be used, so long as they retain coefficients of thermal expansion and elasticity to enable them to expand and contract in response to applied heat. Moreover, in an alternate embodiment, medium 200 includes particles also having coefficients of thermal expansion and elasticity to further tailor the process of shear stress removal of the photoresist.

Figure 2C:
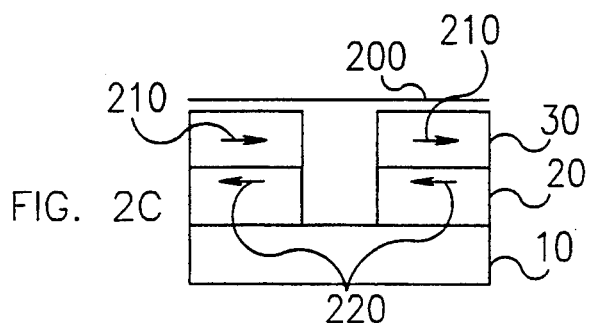

FIG. 2C illustrates the stage of cooling the medium and/or when the medium has been cooled. Directional arrows 210 and 220 are force vectors indicating the shear stress that occurs during the cooling of the medium because of the expanding of the medium due to its coefficient properties of thermal expansion and elasticity. Directional arrows 210 indicate how the expanding causes photoresist 30 to be forced in the shown direction. In contrast, directional arrows 220 depict how the underlying silicon nitride layer 20 on wafer 10 inherently responds with a force in the opposite direction of that shown by arrows 210. These opposing forces create the shear stress necessary to remove photoresist 30 from wafer 10 and/or silicon nitride layer 20.

In the preferred embodiment of the present invention, cooling of medium 200 occurs by quenching wafer 10, silicon nitride layer 20, photoresist 30 and medium 200 in liquid nitrogen. Accordingly, an immediate freezing of the medium occurs to cause the shear stress forces to act upon the photoresist with an emphatic jolt. However, in alternate embodiments, other cooling methods and/or materials are used to substantially cool and/or solidify the medium, such as freezing it, to accomplish similar shear stress forces to occur.

Figure 2D:
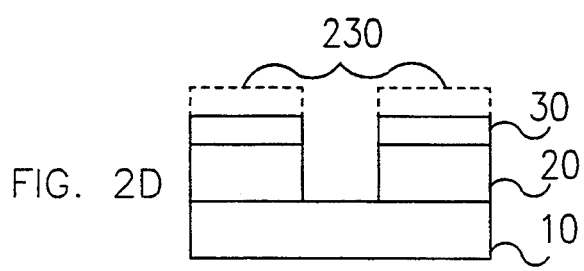

FIG. 2D illustrates a warming of the medium, and/or after the medium has been warmed, and consequently, the medium and any loosened photoresist has been removed from silicon nitride layer 20 and/or wafer 10. Phantom area 230 of photoresist 30, identifies that portion of photoresist 30 which was removed by the shear stress forces depicted in FIG. 2C. In the preferred embodiment, warming occurs simply by coating medium 200 with boiling water. This process removes the solidified medium and loosened photoresist. Alternatively, any well known method of heating works well, so long as the solidified medium is substantially liquified and/or evaporated. Moreover, if the heating is done rapidly, the overall processing time is shortened.

Figure 2E:
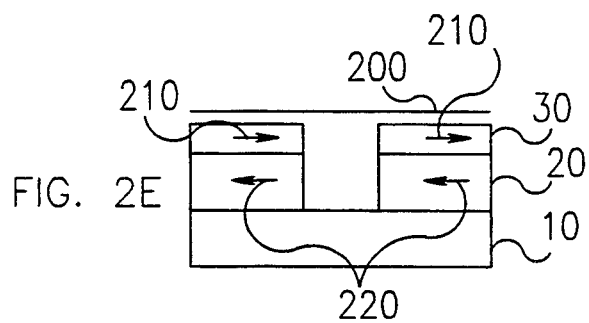

FIG. 2E illustrates how the remaining photoresist 30 is again coated with medium 200, and subsequently cooled, to repeat the removal process. Accordingly, similar to the description in FIG. 2C, shear stress forces in Step E are shown by directional arrows 210 and 220, which cause more of photoresist 30 to be removed.

Figure 2F:
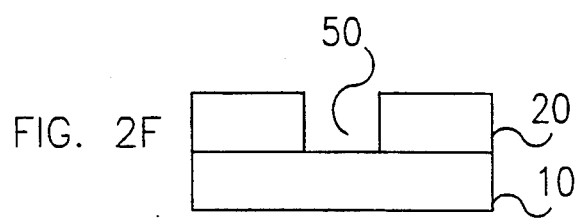

Although not shown, the process of coating, cooling and heating i.e., FIGS. 2B–D, are repeated as often as is necessary until all of photoresist 30 is removed, as shown in FIG. 2F.

FIG. 2F illustrates how wafer 10 and silicon nitride 20 remain after all the photoresist has been removed by the shear stress process. Accordingly, FIG. 2F represents the final result after photoresist has been removed, likewise identified in the photomasking process of FIG. 1E.

In the prior art, it is not uncommon for the photoresist removal process to take an hour of time to accomplish. Under principles of the present invention, the process of coating with a medium and temperature cycling to cause the shear stress removal of photoresist has been accomplished in under 10 minutes. Accordingly, processing time is reduced significantly; the process is much less complex; more cost efficient; and is environmentally favorable.

What has been described above are the preferred embodiments for a process for removal of film from a substrate, and more particularly, photoresist from a semiconductor wafer. It is clear that the present invention provides a powerful tool for removing film and/or photoresist at a considerable time and cost savings. While the present invention has been described by reference to specific embodiments, it will be apparent that other alternative embodiments and methods of implementation or modification may be employed without departing from the true spirit and scope of the invention.

What is claimed is:

1. A method of removing film from a substrate comprising the steps of:
   a) substantially coating the film with a medium having coefficients of thermal expansion and elasticity;
   b) cooling the medium, film and substrate, wherein shear stress occurs between the film and substrate thereby shearing film from the substrate; and,
   c) heating the medium, film and substrate to remove the medium and sheared film from the substrate.

2. The method of removing film according to claim 1 wherein the substrate is a semiconductor wafer.

3. The method of removing film according to claim 1 wherein the film is a photoresist material.

4. The method of removing film according to claim 1 further including repeating the steps of claim 1, as a whole, for a plurality of iterations.

5. The method of removing film according to claim 1 further including performing the steps of claim 1, as a whole, for a plurality of iterations until substantially all the film is removed from the substrate.

6. The method of removing film according to claim 1 wherein the medium is a liquid during the coating step.

7. The method of removing film according to claim 6 wherein the liquid is water.

8. The method of removing film according to claim 1 wherein the medium includes particles having coefficients of thermal expansion and elasticity.

9. The method of removing film according to claim 1 wherein the coating occurs substantially uniformly over the film.

10. The method of removing film according to claim 1 wherein the step of cooling occurs by quenching in a cold substance.

11. The method of removing film according to claim 10 wherein the quenching occurs with liquid nitrogen.

12. The method of removing film according to claim 1 wherein the step of cooling substantially solidifies the medium.

13. The method of removing film according to claim 1 wherein the step of heating substantially liquifies the medium.

14. The method of removing film according to claim 1 wherein the step of heating substantially evaporates the medium.

15. The method of removing film according to claim 1 wherein the medium is heated rapidly.

16. The method of removing film according to claim 1 wherein the medium is heated by hot water.

17. A method of removing photoresist from a semiconductor wafer comprising the steps of:
a) substantially coating the photoresist with a medium having coefficients of thermal expansion and elasticity;
b) cooling the medium, photoresist and wafer, wherein shear stress occurs between the photoresist and wafer thereby shearing photoresist from the wafer; and,
c) heating the medium, photoresist and wafer to remove the medium and sheared photoresist from the wafer.

18. A method of removing photoresist from a silicon nitride layer on a semiconductor wafer comprising the steps of:
a) substantially coating the photoresist with water;
b) quickly cooling the water, photoresist and wafer to a frozen state, wherein the water turns to ice and shear stress occurs between the photoresist and wafer thereby shearing photoresist from the wafer;
c) heating the ice, photoresist and wafer to remove the ice and sheared photoresist from the wafer; and,
d) repeating the previous steps until all of the photoresist is removed.

* * * * *